(12) United States Patent
Jung

(10) Patent No.: US 8,491,799 B2
(45) Date of Patent: Jul. 23, 2013

(54) METHOD FOR FORMING MAGNETIC TUNNEL JUNCTION CELL

(75) Inventor: Jin-Ki Jung, Ichon (KR)

(73) Assignee: Hynix Semiconductor Inc., Icheon-si (KR)

( * ) Notice: Subject to any disclaimer, the term of this patent is extended or adjusted under 35 U.S.C. 154(b) by 1095 days.

(21) Appl. No.: 12/165,363

(22) Filed: Jun. 30, 2008

(65) Prior Publication Data

US 2009/0159563 A1 Jun. 25, 2009

(30) Foreign Application Priority Data

Dec. 21, 2007 (KR) ........................ 10-2007-0135011

(51) Int. Cl.
*B44C 1/22* (2006.01)

(52) U.S. Cl.
USPC .......... 216/22; 216/12; 216/41; 216/46; 216/67; 216/72; 216/75; 216/88; 216/100; 438/3; 438/48; 438/73; 438/210; 438/238; 438/240; 438/246; 438/248; 438/249; 438/421; 438/431; 438/381; 438/595; 438/692; 438/695; 438/720; 438/754; 438/942; 438/975; 360/324; 360/324.1; 360/324.11; 360/324.12; 360/324.2

(58) Field of Classification Search
USPC ............... 216/12, 22, 41, 46, 67, 72, 75, 88, 216/100; 360/324, 324.1, 324.11, 324.12, 360/324.2; 438/3, 48, 73, 210, 238, 240, 438/246, 248, 249, 421, 431, 381, 595, 692, 438/695, 696, 720, 754, 942, 975
See application file for complete search history.

(56) References Cited

U.S. PATENT DOCUMENTS

| | | | |
|---|---|---|---|
| 6,485,989 B1 * | 11/2002 | Signorini | 438/3 |
| 6,656,371 B2 * | 12/2003 | Drewes | 216/22 |
| 6,852,550 B2 * | 2/2005 | Tuttle et al. | 438/3 |
| 6,893,893 B2 * | 5/2005 | Nallan et al. | 438/61 |
| 6,897,532 B1 * | 5/2005 | Schwarz et al. | 257/367 |
| 7,151,652 B2 * | 12/2006 | Nickel et al. | 360/324.11 |
| 7,320,942 B2 * | 1/2008 | Chen et al. | 438/754 |
| 7,480,175 B2 * | 1/2009 | Dieny et al. | 365/171 |
| 7,696,551 B2 * | 4/2010 | Xiao et al. | 257/295 |
| 7,936,027 B2 * | 5/2011 | Xiao et al. | 257/421 |
| 2004/0129361 A1 * | 7/2004 | Chen et al. | 156/58 |
| 2009/0042388 A1 * | 2/2009 | Sun et al. | 438/689 |
| 2009/0159562 A1 * | 6/2009 | Cho et al. | 216/22 |

FOREIGN PATENT DOCUMENTS

| | | |
|---|---|---|
| KR | 1020040060313 A | 7/2004 |
| KR | 1020040110380 A | 12/2004 |

\* cited by examiner

*Primary Examiner* — Nadine Norton
*Assistant Examiner* — Christopher Remavege
(74) *Attorney, Agent, or Firm* — Kilpatrick Townsend & Stockton LLP

(57) ABSTRACT

A method for forming a magnetic tunnel junction cell includes forming a pinning layer, a pinned layer, a dielectric layer and a free layer over a first electrode, forming a second electrode on the free layer, etching the free layer and the dielectric layer using the second electrode as an etch barrier to form a first pattern, forming a prevention layer on a sidewall of the first pattern, and etching the pinned layer and the pinning layer using the second electrode and the prevention layer as an etch barrier to form a second pattern.

10 Claims, 7 Drawing Sheets

Ar/HBr/CO

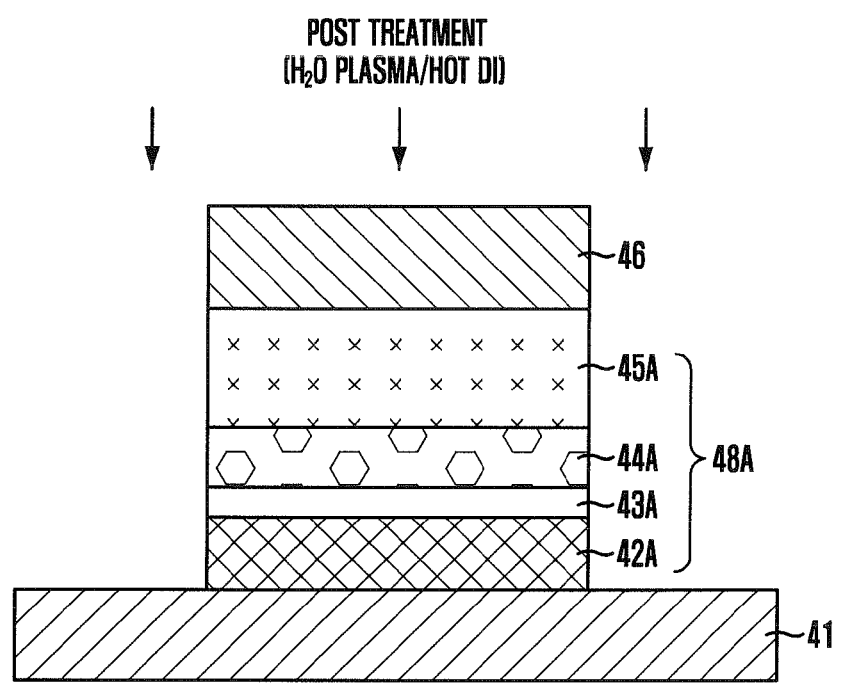

METHOD FOR FORMING MAGNETIC TUNNEL JUNCTION CELL

CROSS-REFERENCE TO RELATED APPLICATIONS

The present invention claims priority of Korean patent application number 2007-0135011, filed on Dec. 21, 2007, which is incorporated by reference in its entirety.

BACKGROUND OF THE INVENTION

The present invention relates to a method for manufacturing a semiconductor device, and more particularly, to a method for forming a magnetic tunnel junction (MTJ) cell.

Recently, as semiconductor devices become highly integrated, magnetic random access memory (MRAM) has attracted a good deal of attention as a next generation high performance non-volatile semiconductor memory device. The MRAM includes a transistor performing a switching operation, and an MTJ cell for storing data. The MTJ cell includes a magnetic tunnel junction unit having a dielectric layer interposed between two ferromagnetic layers. The electric resistance of the MTJ cell is changed in according to a magnetization orientation of the two ferromagnetic layers. Using a voltage change or a current change according to the resistance change, it can be determined which logic level ("1" or "0") the data stored in the MTJ cell has.

FIG. 1 illustrates a cross-sectional view of a typical MTJ cell on which an etch byproduct is deposited. FIG. 2 illustrates a micrographic view of a typical MTJ cell on which an etch byproduct is deposited.

Referring to FIGS. 1 and 2, a pinning layer 12, a pinned layer 13, a dielectric layer 14, and a free layer 15 are sequentially formed over a first electrode 11. The pinning layer 12, the pinned layer 13, and the free layer 15 are formed of metal compounds.

Then, a second electrode 16 is formed over the free layer 15. Using the second electrode 16 as an etch barrier, the free layer 15, the dielectric layer 14, the pinned layer 13 and the pinning layer 12 are sequentially etched to form an MTJ cell. Here, the free layer 15 and the pinned layer 13 should be separated electrically by the dielectric layer 14 so that the MTJ cell operates normally.

However, the typical method for forming the MTJ cell may produce a conductive etch byproduct during etching, as represented by circle "A" in FIGS. 1 and 2, thereby deteriorating the electrical properties of the MTJ cell. The metal compounds forming the pinning layer 12, the pinned layer 13 and the free layer 15 have high boiling points. Accordingly, the conductive etch by product 18 produced during the etching of the metal compounds is evaporated, but redeposited on the side wall of the MTJ cell. The conductive etch byproduct 18 redeposited on a sidewall of an MTJ portion 17 can short the pinned layer 13 and the free layer 15, deteriorating the electrical properties of the MTJ cell. This may cause a fail in a semiconductor device, such as an MRAM, to which the MTJ cell is applied, decreasing reliability and manufacturing yield of the semiconductor device. The conductive etch byproduct 18 deposited on the sidewall of the MTJ portion 17 is produced during the etching of the pinning layer 12. Accordingly, there is a need for a method for preventing the deterioration of the electric property of the MTJ cell caused by the conductive etch byproduct 18.

SUMMARY OF THE INVENTION

Embodiments of the present invention relate to a method for forming an MTJ cell, capable of preventing deterioration of electrical properties of the MTJ cell that is caused by a conductive etch byproduct produced during etching.

In accordance with a first aspect of the present invention, there is provided a method for forming a magnetic tunnel junction cell. The method includes forming a pinning layer, a pinned layer, a dielectric layer and a free layer over a first electrode, forming a second electrode on the free layer, etching the free layer and the dielectric layer using the second electrode as an etch barrier to form a first pattern, forming a short prevention layer on a sidewall of the first pattern, and etching the pinned layer and the pinning layer using the second electrode and the short prevention layer as an etch barrier to form a second pattern.

In accordance with a second aspect of the present invention, there is provided a method for forming a magnetic tunnel junction cell, the method. The method includes forming a pinning layer, a pinned layer, a dielectric layer and a free layer over a first electrode, forming a second electrode on the free layer, etching the free layer, the dielectric layer and the pinned layer using the second electrode as an etch barrier to form a first pattern; forming a short prevention layer on a sidewall of the first pattern, and etching the pinning layer using the second electrode and the short prevention layer as an etch barrier to form a second pattern.

In accordance with a third aspect of the present invention, there is provided a method for forming a magnetic tunnel junction cell. The method includes sequentially forming a free layer, a dielectric layer, a pinned layer and a pinning layer over a first electrode, forming a second electrode on the pinning layer, and sequentially etching the pinning layer, the pinned layer, the dielectric layer and the free layer using the second electrode as a etch barrier.

BRIEF DESCRIPTION OF THE DRAWINGS

FIGS. 4A to 4C illustrate cross-sectional views of an MTJ cell formed by a method in accordance with a second embodiment of the present invention.

DESCRIPTION OF SPECIFIC EMBODIMENTS

The method for forming the MTJ cell can prevent a short between a free layer and a pinned layer caused by a conductive etch byproduct produced during etching of a pinning layer.

A method for forming an MTJ cell in accordance with a first embodiment will be described below. The method is based on forming a short prevention layer on a sidewall of a structure that is formed before etching of a pinning layer. As such, it is possible to prevent deterioration of electrical properties of the MTJ cell caused by an etch byproduct produced during the etching.

FIGS. 3A to 3F illustrate cross-sectional views of the MTJ cell formed by the method in accordance with the first embodiment of the present invention.

Figure 1:
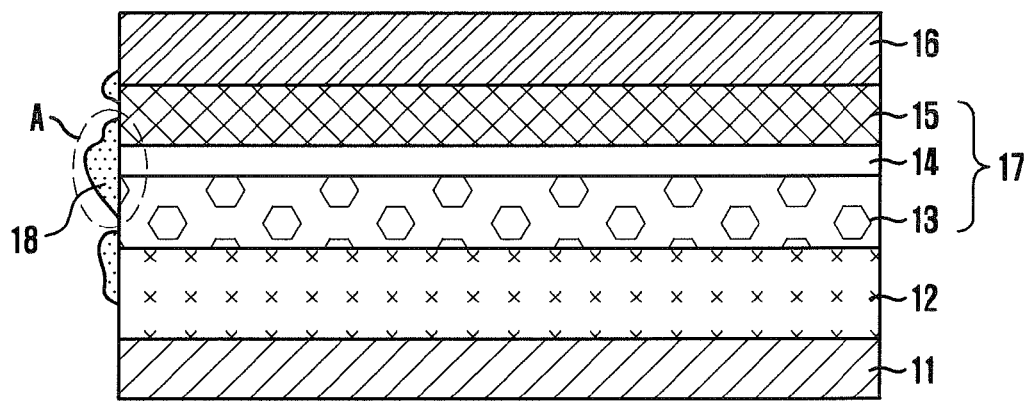
FIG. 1 illustrates a cross-sectional view of a typical MTJ cell on which an etch byproduct is deposited.
Figure 2:
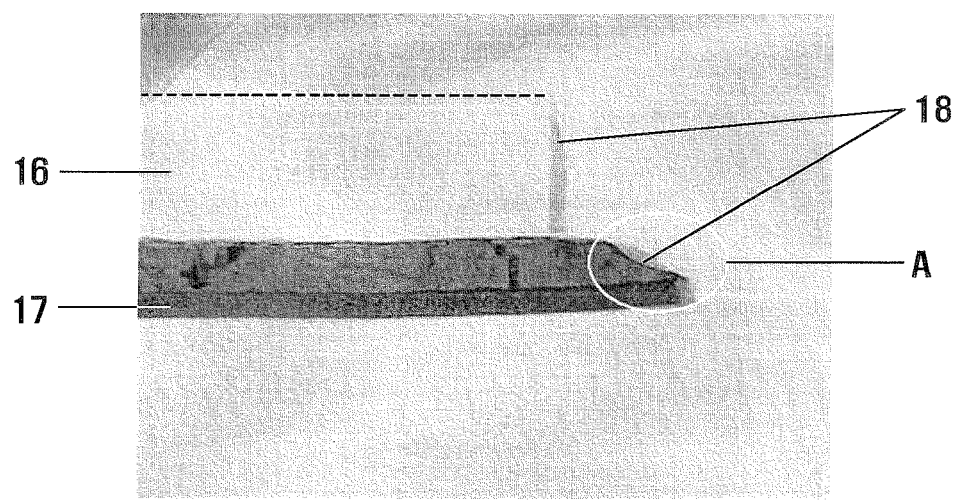
FIG. 2 illustrates a micrographic view of a typical MTJ cell on which an etch byproduct is deposited.
Figure 3A:
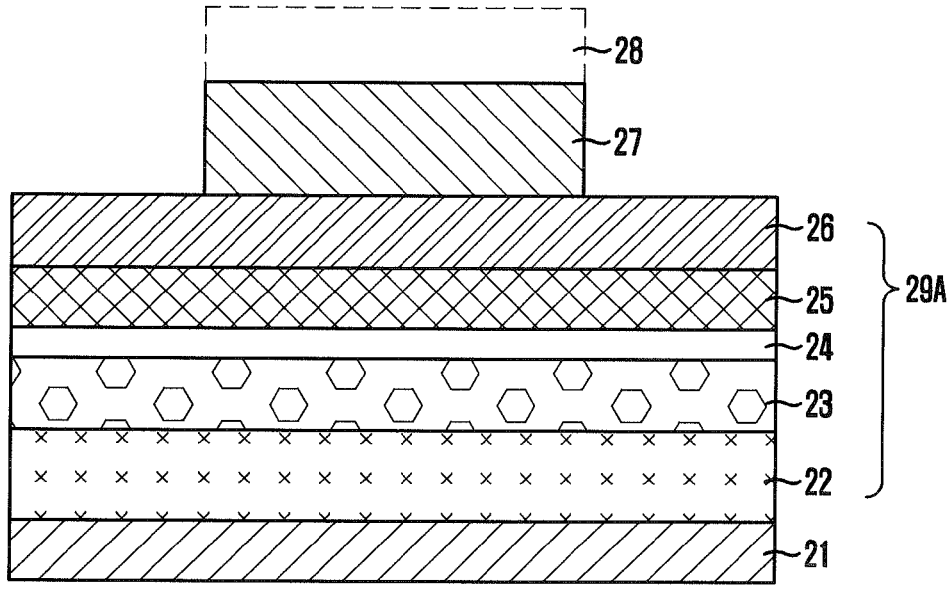
FIGS. 3A to 3F illustrate cross-sectional views of an MTJ cell formed by a method in accordance with a first embodiment of the present invention.

Referring to FIG. 3A, after forming a certain structure (not shown) such as a transistor through a series of processes, a first electrode 21 is formed over the structure. The first electrode 21 may be formed of tantalum.

Then, a pinning layer 22, a pinned layer 23 a dielectric layer 24, a free layer 25, and a capping layer 26 are sequentially formed over the first electrode 21. The pinning layer 22 is configured to fix a magnetization orientation of the pinned layer 23. The pinning layer 22 may be formed of an anti-ferromagnetic metal compound such as platinum manganese (PtMn) and iridium manganese (IrMn). The pinning layer 22 may be formed to a thickness of approximately 100 Å to approximately 300 Å.

The pinned layer 23 and the free layer 25 each may be a single layer formed of a ferromagnetic metal compound such as ferro-nickel (NiFe) and ferro-cobalt (CoFe). The pinned layer 23 and the free layer 25 each may also be multiple layers such as CoFe/Ru/CoFe where a ruthenium (Ru) is layered between ferro-cobalts (CoFe), and NiFe/Ru/NiFe where a ruthenium (Ru) is layered between ferro-nickels (NiFe). The pinned layer 23 and the free layer 25 each may be formed to a thickness of approximately 40 Å to approximately 80 Å.

The dielectric layer 24 is configured as a tunneling barrier between the pinned layer 23 and the free layer 25. The dielectric layer may be formed of magnesium oxide (MgO) or aluminum oxide ($Al_2O_3$) to a thickness of approximately 10 Å to approximately 20 Å.

The capping layer 26 is configured to prevent oxidation and corrosion of the metal element in the metal compound of the free layer 25. The capping layer 26 may be formed of tantalum (Ta) or tantalum nitride (TaN). Oxidation or corrosion of the metal element of the metal oxide constituting the free layer 25 due to an operational error may decrease a magnetoresistance $R_{ms}$ of the MTJ cell, causing a malfunction of an MRAM device utilizing the MTJ cell. Accordingly, the capping layer 26 is formed to prevent the oxidation and the corrosion of the metal element of the metal compound of the free layer 25.

The magnetoresistance $R_{ms}$ is defined as a percentage ratio of the resistance difference between the MTJ cell in a high resistance state and in a low resistance state to the resistance of the MTJ cell in the low resistance state. When the magnetoresistance $R_{ms}$ is decreased, the resistance difference between the MTJ cell in the high resistance and in the low resistance state may be reduced, thereby reducing the data storage characteristic of the MRAM device utilizing the MTJ cell.

Next, a conductive layer for a second electrode is formed over the capping layer 26. The conductive layer for the second electrode may be formed of titanium nitride (TiN). A photoresist pattern 28 is formed over the conductive layer for the second electrode.

The conductive layer for the second electrode is etched using the photoresist pattern 28 as an etch barrier to form a second electrode 27. Then the photoresist pattern 28 is removed through a strip. This is because the subsequent etching for forming the MTJ cell is performed at a high temperature, for example, from approximately 100° C. to approximately 500° C. to easily remove etch byproducts produced during the etching for forming the MTJ cell and to increase etching speed. Since the photoresist pattern 28 may be lost during the high temperature etching and thus may contaminate the MTJ cell, the photoresist pattern 28 may be removed after forming the second electrode 27.

The reason for performing the etching for forming the MTJ cell at the high temperature of approximately 100° C. to approximately 500° C. will be described later.

Figure 3B:
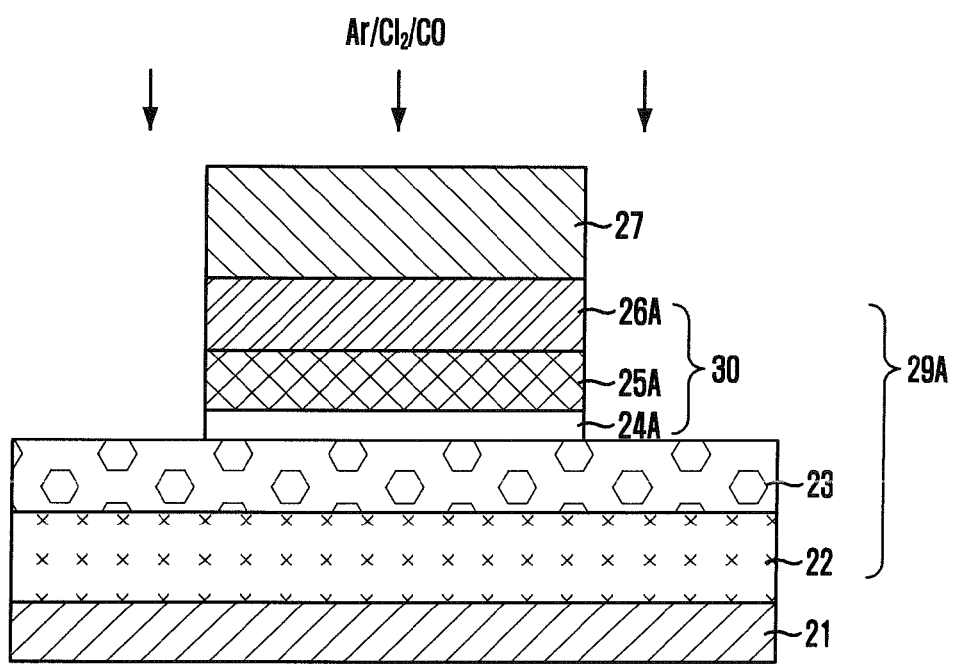

Referring to FIG. 3B, the capping layer 26, the free layer 25 and the dielectric layer 24 are sequentially etched using the second electrode 27 as an etch barrier to form a capping pattern 26A, a free pattern 25A and a dielectric pattern 24A, respectively. The structure including the capping pattern 26A, the free pattern 25A and the dielectric pattern 24A is referred to as a first pattern 30.

The first pattern 30 may also be formed by sequentially etching the capping layer 26, the free layer 25, the dielectric layer 24 and the pinned layer 23 using the second electrode as an etch barrier.

The etching for forming the first pattern 30 may be performed by dry etching using an inert gas such as argon (Ar) gas, and an etching gas selected from the group consisting of chlorine ($Cl_2$) gas, hydrogen bromide (HBr) gas, methanol ($CH_3OH$) gas, carbon monoxide (CO) gas, and a combination thereof. The etching gas may be a mixed gas including methanol ($CH_3OH$) gas or carbon monoxide (CO) gas. The mixed gas including methanol ($CH_3OH$) gas or carbon monoxide (CO) gas can improve the etching speed, and can reduce the redeposition of the etch byproduct produced during the forming of the first pattern 30 on a surface of the first pattern 30.

Specifically, when carbon monoxide (CO) gas is used as the etching gas in the etching for forming the first pattern 30, an etch byproduct is formed, which has a structure (such as $Fe(Co)_x$ where x is a natural number) where a metal compound, e.g., ferro-nickel (NiFe) or ferro-cobalt (CoFe), of the free pattern 25A is combined with carbon monoxide (CO) gas. Such an etch byproduct has a volatility higher than that of an etch byproduct having a structure (such as $Fe(Cl)_x$ where x is a natural number) where the metal compound is combined with chlorine (Cl) or bromine (Br). Accordingly, when a mixed gas including methanol ($CH_3OH$) gas or carbon monoxide (CO) gas is used as the etch gas to etch the metal compound of the free pattern 25A, an etch byproduct of a high volatility is produced. As such, the etching speed can be improved, and the redeposition of the etch byproduct on the sidewall of the first pattern 30 can be reduced.

In addition, the etching for forming the first pattern 30 may be performed at a high temperature, for example, from approximately 100° C. to approximately 500° C. This is because the boiling temperature of the metal compound, such as ferro-nickel (NiFe) and ferro-cobalt (CoFe), of the free pattern 25A is extremely high, i.e., above 1,000° C. As well known, an etch byproduct produced during etching of a material of a high boiling temperature has a low volatility. Accordingly, by performing the etching at a high temperature of approximately 100° C. to approximately 500° C., the volatility of the etch byproduct can be increased further.

Figure 3C:
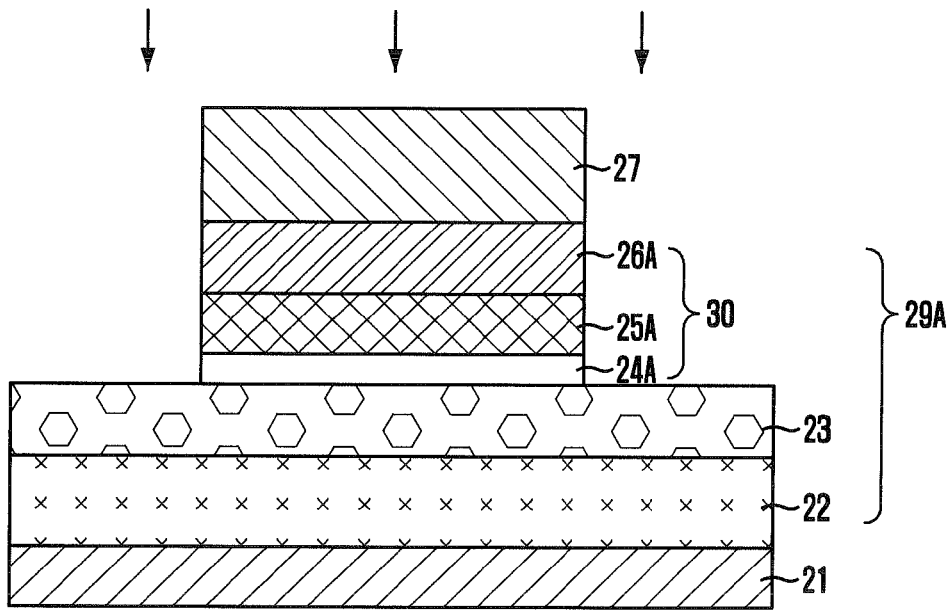

Referring to FIG. 3C, after forming the first pattern 30, a first post treatment is performed. The first post treatment may be performed by a $H_2O$ plasma treatment followed by a hot deionized water treatment. The first post treatment may be performed at a temperature ranging from approximately 100° C. to approximately 500° C.

Through the first post treatment, it is possible to remove the etch byproduct that is produced during the etching for forming the first pattern 30 and prevent it from being redeposited on the first pattern 30. In addition, it is also possible to prevent corrosion of a metal element, such as iron (Fe), of a metal compound constituting the free pattern 25A. Here, the corrosion of the iron results from a combination of the iron (Fe) with halogen gas, such as chlorine (Cl) gas and bromine (Br) gas, of the etch gas used during the etching for forming the first pattern 30. Accordingly, by removing the chlorine (Cl) or the bromine (Br) combined with the iron (Fe) after converting it to hydrogen chloride (HCl) gas or hydrogen bromide (HBr) gas, it is possible to prevent oxidation or corrosion of the metal element of the metal compound constituting the free pattern 25A.

For reference, as described above with reference to FIG. 3A, oxidation or corrosion of the metal element of the metal oxide constituting the free pattern 25A due to an operational error may decrease a magnetoresistance $R_{ms}$ of the MTJ cell, causing a malfunction of an MRAM device utilizing the MTJ cell. Accordingly, the first post treatment is performed to prevent this.

Figure 3D:
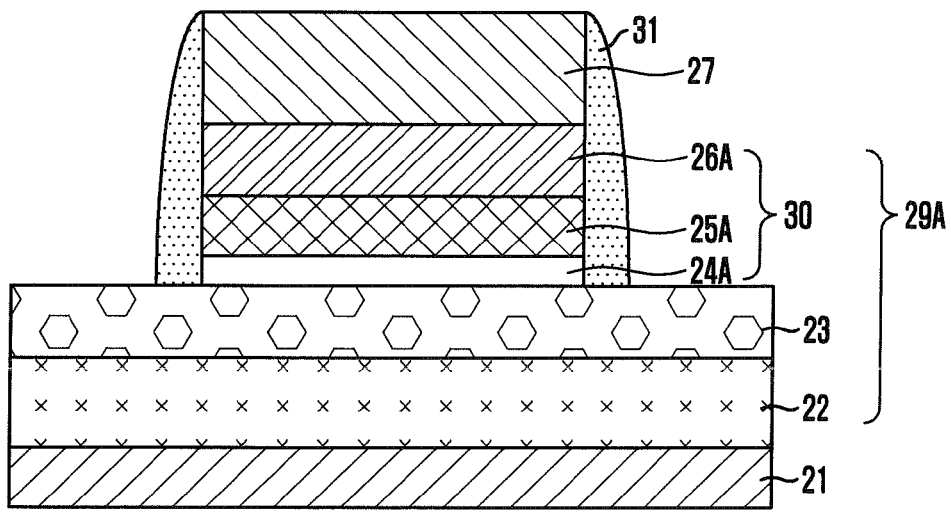

Referring to FIG. 3D, a short prevention layer 31 is formed on both sidewalls of the first pattern 30. The short prevention layer 31 is configured to prevent redeposition of conductive etch byproducts produced during subsequent etching of the pinning layer 22 on the sidewalls of the first pattern. That is, the short prevention layer 31 is configured to prevent the free pattern 25A and the pinned layer 23 from being shorted by the conductive etch byproduct produced during the etching of the pinning layer 22. The short prevention layer 31 may be formed by forming a dielectric layer for preventing a short over the resulting structure including the first pattern 30, and then performing an etch back process.

The short prevention layer 31 may be a single layer selected from the group consisting of an oxide layer, a nitride layer, and an oxynitride layer, or multiple layers thereof. The oxide layer may be formed of silicon oxide ($SiO_2$), boron phosphorus silicate glass (BPSG), phosphorus silicate glass (PSG), tetra ethyle ortho silicate (TEOS), undoped silicate glass (USG), spin on glass (SOG), high density plasma (HDP) oxide, or spin on dielectric (SOD). The nitride layer may be formed of silicon nitride ($Si_3N_4$).

In addition, the short prevention layer 31 may also be a polymer layer. The polymer layer may be formed of a gas selected from the group consisting of a carbon fluoride gas, a hydrocarbon gas, a methyl fluoride gas, and a combination thereof. The carbon fluoride gas may be perfluoroethane ($C_2F_6$), hexafluoro-1,3-Butadiene ($C_4F_6$), octafluorocyclopentene ($C_5F_8$), octafluorocyclobutane ($C_4F_8$) or perfluoropropane ($C_3F_3$), the hydrocarbon gas may be methane ($CH_4$) or tetrafluoroethylene ($C_2F_4$), and the methyl fluoride gas may be fluoroform ($CHF_3$), difluoromethane ($CH_2F_2$) or fluoromethane ($CH_3F$). The polymer layer is a material layer having a constitution similar to that of the photoresist. However, the polymer layer has a greater hardness and a greater thermal stability than the photoresist. Thus, the polymer layer is not lost at a high temperature of approximately 100° C. to approximately 500° C. Accordingly, the polymer layer is not lost during the following etching for forming the MTJ cell, i.e., during the etching for forming the second pattern 32.

Figure 3E:
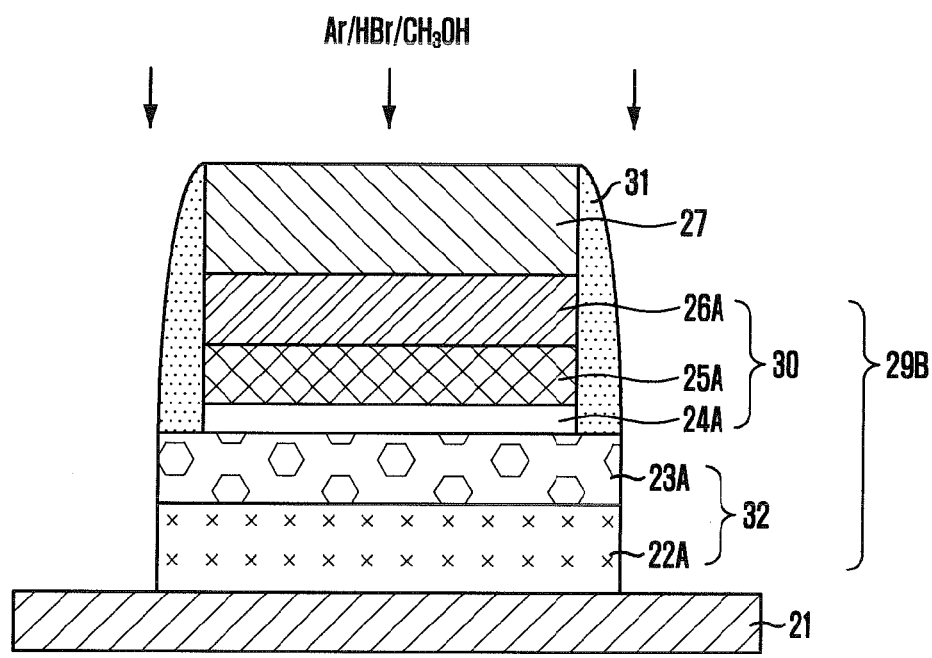

Referring to FIG. 3E, the pinned layer 23 and the pinning layer 22 are sequentially etched using the second electrode 27 and the short prevention layer 31 as an etch barrier to form a second pattern 32. Hereinafter, the reference numerals "23A" and "22A" represent etched layers of the pinned layer 23 and the pinning layer 22, respectively.

When the first pattern is formed by etching the pinned layer 23 as well as the capping layer 26, the free layer 25 and the dielectric layer 24, the second pattern is formed by etching the pinning layer 22 using the second electrode 27 and the short prevention layer 31 as an etch barrier. That is, the etched pinning layer constitutes the second pattern.

The etching for forming the second pattern 32 may be performed in the same manner as the etching for forming the first pattern 30. For example, the etching for forming the second pattern 32 may be performed by dry etching using an inert gas such as argon (Ar) gas, and an etching gas selected from the group consisting of chlorine ($Cl_2$) gas, hydrogen bromide (HBr) gas, methanol ($CH_3OH$) gas, carbon monoxide (CO) gas, and a combination thereof. The etching for forming the second pattern 32 may be performed at a temperature of approximately 100° C. to approximately 500° C. As such, the volatility of the etch byproduct produced during the etching for forming the second pattern 32 can be increased, thereby improving the etching speed and reducing the redeposition of the etch byproduct on the second pattern 32.

In addition, the short prevention layer 31 can prevent the conductive etch byproduct, which is produced during the etching of the pinning layer, from redepositing on the sidewall of the MTJ portion, i.e., on the sidewalls of the free pattern 25A and the pinned pattern 23A. As such, a short between the free pattern 25A and the pinned pattern 23A can be prevented.

Figure 3F:
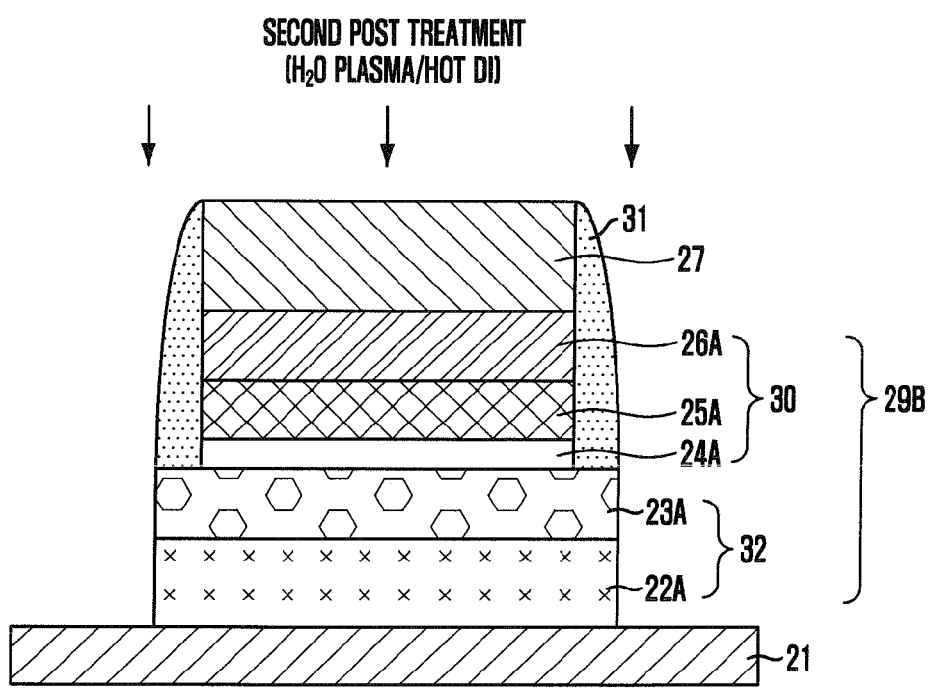

Referring to FIG. 3F, after forming the second pattern 32, a second post treatment is performed. The second post treatment may be performed by a $H_2O$ plasma treatment followed by a hot deionized water treatment. The second post treatment may be performed at a temperature range from approximately 100° C. to approximately 500° C.

Through the second post treatment, it is possible to remove the etch byproduct that is produced during the etching for forming the second pattern 32 and prevent it from being redeposited on the second pattern 32. In addition, it is also possible to prevent oxidation or corrosion of a metal element of a metal compound constituting the pinned pattern 23A.

For reference, as described above with reference to FIG. 3A, oxidation or corrosion of the metal element of the metal oxide constituting the free pattern 25A due to an operational error may decrease a magnetoresistance $R_{ms}$ of the MTJ cell, causing a malfunction of an MRAM device utilizing the MTJ cell. This is the same for the oxidation or corrosion of the metal element of the metal oxide constituting the free pattern 25A. Accordingly, the second post treatment is performed to prevent the oxidation or the corrosion of the pinned pattern 23A, and thus to prevent the decrease of the magnetoresistance $R_{ms}$ of the MTJ cell.

When the short prevention layer 31 is a polymer layer, the short prevention layer 31 may be removed before the second post treatment. This is because the polymer layer has a poor interfacial property with an interlayer dielectric layer that will be formed in a subsequent process to cover the MTJ cell, and thus may cause a crack in the interlayer dielectric layer. The short prevention layer 31 of the polymer layer may be removed using an $O_2$ plasma process.

Through the above described processes, the MTJ cell in accordance with the first embodiment of the present invention can be formed.

As described above, by forming the short prevention layer 31, it is possible to prevent a short between the free pattern 25A and the pinned pattern 23A caused by the conductive etch byproduct produced during the etching of the pinning layer 22.

In addition, by performing the post treatment, it is possible to remove the etch byproduct produced during the forming of the first pattern 30 and the second pattern 32, and it is also possible to prevent oxidation and corrosion of the metal element of the metal compound constituting the free pattern 25A and the pinned pattern 23A.

As such, it is possible to improve reliability and manufacturing yield of the semiconductor device utilizing the MTJ cell.

Hereinafter, a method for forming an MTJ cell in accordance with a second embodiment will be described. The second embodiment is based on forming the layers in a sequence of a free layer, a dielectric layer, a pinned layer and a pinning layer, which is different from that of the first embodiment, and then performing etching. That is, by etching the pinning layer first, it is possible to prevent the electric property of the MTJ cell from being deteriorated by the conductive etch byproduct produced during the etching of the pinning layer.

Figure 4A:
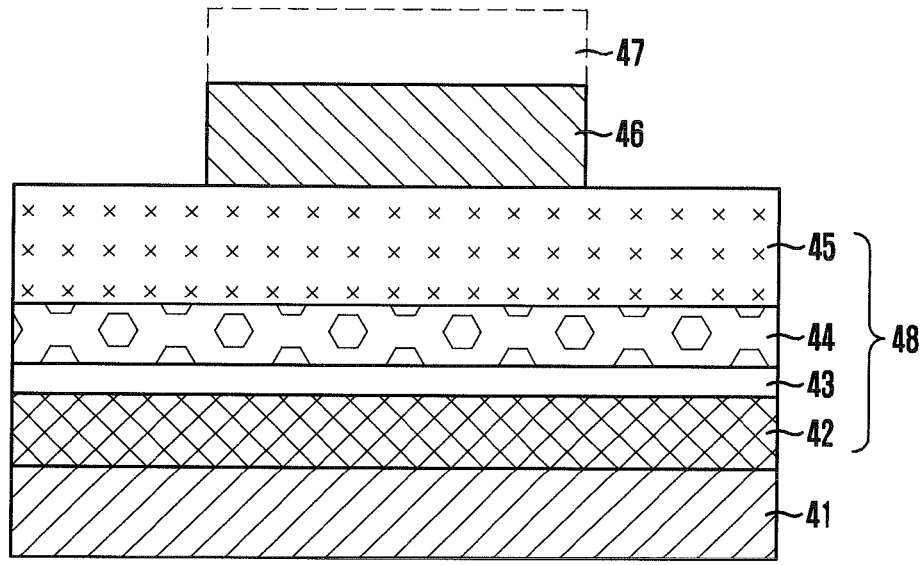
Figure 4B:
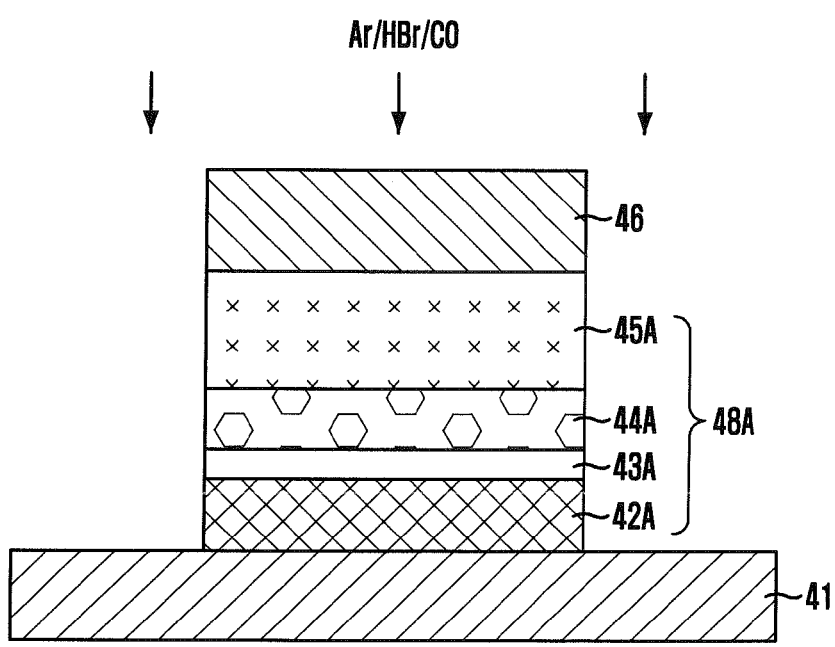

FIGS. 4A to 4C illustrate cross-sectional views of an MTJ cell formed by a method in accordance with the second embodiment of the present invention.

Referring to FIG. 4A, after forming a certain structure (not shown) such as a transistor through a series of processes, a first electrode 41 is formed over the structure. The first electrode 41 may be formed of tantalum.

Then, a free layer 42, a dielectric layer 43, a pinned layer 44 and a pinning layer 45 are sequentially formed over the first electrode 41. The pinning layer 45 is configured to fix a magnetization orientation of the pinned layer 44. The pinning layer 45 may be formed of an anti-ferromagnetic metal compound such as platinum manganese (PtMn) and iridium manganese (IrMn). The pinning layer 45 may be formed to a thickness of approximately 100 Å to approximately 300 Å.

The pinned layer 44 and the free layer 42 each may be a single layer formed of a ferromagnetic metal compound such as ferro-nickel (NiFe) and ferro-cobalt (CoFe). The pinned layer 44 and the free layer 42 each may also be multiple layers such as CoFe/Ru/CoFe where a ruthenium (Ru) is layered between ferro-cobalts (CoFe), and NiFe/Ru/NiFe where a ruthenium (Ru) is layered between ferro-nickels (NiFe). The pinned layer 44 and the free layer 42 each may be formed to a thickness of approximately 40 Å to approximately 80 Å.

The dielectric layer 43 is configured as a tunneling barrier between the pinned layer 44 and the free layer 42. The dielectric layer may be formed of magnesium oxide (MgO) or aluminum oxide ($Al_2O_3$) to a thickness of approximately 10 Å to approximately 20 Å.

Next, a conductive layer for a second electrode is formed over the pinning layer 45. The conductive layer for the second electrode may be formed of titanium nitride (TiN). A photoresist pattern 47 is formed over the conductive layer for the second electrode.

The conductive layer for the second electrode is etched using the photoresist pattern 47 as an etch barrier to form a second electrode 46. Then the photoresist pattern 47 is removed through a strip. This is because the subsequent etching for forming the MTJ cell is performed at a high temperature (for example, from approximately 100° C. to approximately 500° C.) to remove etch byproducts produced during the etching for forming the MTJ cell easily and to increase etching speed. Since the photoresist pattern 47 may be lost during the high temperature etching and thus may contaminate the MTJ cell, the photoresist pattern 47 may be removed after forming the second electrode 46.

Referring to FIG. 4B, the pinning layer 45, the pinned layer 44, the dielectric layer 43 and the free layer 42 are sequentially etched using the second electrode 46 as an etch barrier to form the MTJ cell, i.e., to form a pinning pattern 45A, a pinned pattern 44A, a dielectric pattern 43A and a free pattern 42A, respectively.

By forming the pinning pattern 45A first, it is possible to prevent the conductive etch byproduct produced during the etching of the pinning layer 45A from redepositing on a sidewall of the MTJ portion. Consequently, the short between the pinned pattern 44A and the free pattern 42A can be prevented.

The etching may be performed by dry etching using an inert gas such as argon (Ar) gas, and an etching gas selected from the group consisting of chlorine ($Cl_2$) gas, hydrogen bromide (HBr) gas, methanol ($CH_3OH$) gas, carbon monoxide (CO) gas, and a combination thereof. The etching gas may be a mixed gas including methanol ($CH_3OH$) gas or carbon monoxide (CO) gas. The mixed gas including methanol ($CH_3OH$) gas or carbon monoxide (CO) gas can improve the etching speed, and can reduce the redeposition of the etch byproduct produced during the forming of the first pattern 30 on a surface of the first pattern 30.

In addition, the etching may be performed at a high temperature, for example, from approximately 100° C. to approximately 500° C. This is because the boiling temperature of the metal compound, such as ferro-nickel (NiFe) and ferro-cobalt (CoFe), constituting the free pattern 42A, the pinned pattern 44A and a pinned layer 45A is extremely high, i.e., above 1,000° C. As well known, an etch byproduct produced during etching of a material of a high boiling temperature has a low volatility. Accordingly, by performing the etching at a high temperature of approximately 100° C. to approximately 500° C., the volatility of the etch byproduct can be increased further.

Referring to FIG. 3C, after forming the MTJ cell, a post treatment is performed. The post treatment may be performed by a $H_2O$ plasma treatment followed by a hot deionized water treatment. The post treatment may be performed at a temperature ranging from approximately 100° C. to approximately 500° C.

Through the post treatment, it is possible to remove the etch byproduct that is produced during the etching for forming the MTJ cell and prevent it from being redeposited on the MTJ cell. In addition, it is also possible to prevent oxidation and corrosion of a metal element of a metal compound constituting the free pattern 42A and the pinned pattern 44A.

For reference, as described above with reference to FIG. 3A, oxidation or corrosion of the free pattern 42A and the pinned pattern 44A due to an operational error may decrease a magnetoresistance $R_{ms}$ of the MTJ cell, causing a malfunction of an MRAM device utilizing the MTJ cell. Accordingly, the post treatment is performed to prevent this.

Through the above described processes, the MTJ cell in accordance with the second embodiment of the present invention can be formed.

As described above, by etching the pinning layer 45 before the etching of the free layer 42 and the pinned layer 44, it is possible to prevent the deterioration of the electric property of the MTJ cell due to the conductive etch byproduct produced during the etching of the pinning layer 45.

In addition, by performing the post treatment, it is possible to prevent oxidation and corrosion of the metal element of the metal compound constituting the free pattern 42A and the pinned pattern 44A, and thus to improve electrical properties of the MTJ cell.

As such, it is possible to improve reliability and manufacturing yield of the semiconductor device utilizing the MTJ cell.

As described above, by forming a short prevention layer before etching the pinning layer, it is possible to prevent deterioration of electric property of the MTJ cell due to a conductive etch byproduct produced during the etching of the pinning layer.

In addition, by sequentially forming the layers in the sequence of the free layer, the dielectric layer, the pinned layer and the pinning layer, and etching the pinning layer first, it is possible to prevent deterioration of electric property of the MTJ cell due to an etch byproduct produced during the etching of the pinning layer.

As such, it is possible to improve reliability and manufacturing yield of the semiconductor device utilizing the MTJ cell.

While the present invention has been described with respect to the specific embodiments, it will be apparent to those skilled in the art that various changes and modifications may be made without departing from the spirit and scope of the invention as defined in the following claims.

What is claimed is:

1. A method for forming a magnetic tunnel junction cell, the method comprising:
    forming a pinning layer, a pinned layer, a dielectric layer and a free layer over a first electrode;
    forming a second electrode on the free layer;
    etching the free layer, the dielectric layer and the pinned layer using the second electrode as an etch barrier to form a first pattern;
    forming a prevention layer on a sidewall of the first pattern;
    etching the pinning layer using the second electrode and the prevention layer as an etch barrier to form a second pattern; and
    performing a post treatment after etching the pinning layer and before etching the first electrode,
    wherein the prevention layer is a polymer layer, wherein the polymer layer is removed after etching the pinning layer to form the second pattern, and before performing the post treatment.

2. The method of claim 1, wherein the polymer layer is formed using a gas selected from the group consisting of a carbon fluoride gas, a hydrocarbon gas, a methyl fluoride gas, and a combination thereof.

3. The method of claim 1, wherein etching the free layer, the dielectric layer and the pinned layer and etching the pinning layer are performed using a gas selected from the group consisting of $CH_3OH$ gas, $CO$ gas, $Cl_2$ gas, $HBr$ gas and a combination thereof.

4. The method of claim 1, wherein etching the free layer, the dielectric layer and the pinned layer and etching the pinning layer are performed at a temperature of approximately 100° C. to approximately 500° C.

5. The method of claim 1, further comprising performing another post treatment after etching the free layer, the dielectric layer and the pinned layer and before forming the prevention layer.

6. The method of claim 5, wherein the post treatment comprises:
    performing a $H_2O$ plasma treatment; and
    performing a hot deionized water treatment.

7. The method of claim 5, wherein the post treatment is performed at a temperature of approximately 100° C. to approximately 500° C.

8. A method for forming a magnetic tunnel junction cell, the method comprising:
    forming a pinning layer, a pinned layer, a dielectric layer and a free layer over a first electrode;
    forming a second electrode on the free layer;
    etching the free layer, the dielectric layer and the pinned layer using the second electrode as an etch barrier to form a first pattern;
    performing a first post treatment after etching the free layer, the dielectric layer and the pinned layer;
    forming a prevention layer on a sidewall of the first pattern after performing the first post treatment;
    etching the pinning layer using the second electrode and the prevention layer as an etch barrier to form a second pattern; and
    performing a second post treatment after etching the pinning layer and before etching the first electrode,
    wherein the prevention layer is a polymer layer, wherein the polymer layer is removed after etching the pinning layer to form the second pattern, and before performing the post treatment.

9. The method of claim 8, wherein the first post treatment comprises performing a H2O plasma treatment followed by a hot deionized water treatment at a temperature of approximately 100° C. to approximately 500° C.

10. The method of claim 8, wherein the second post treatment comprises performing a H2O plasma treatment followed by a hot deionized water treatment at a temperature of approximately 100° C. to approximately 500° C.

* * * * *